(12) United States Patent
An et al.

(10) Patent No.: US 7,045,876 B2
(45) Date of Patent: May 16, 2006

(54) AMORPHIZING ION IMPLANT METHOD FOR FORMING POLYSILICON EMITTER BIPOLAR TRANSISTOR

(75) Inventors: Feng-Yuan An, Hsin-Chu (TW); Huan-Wen Wang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/834,782

(22) Filed: Apr. 28, 2004

(65) Prior Publication Data

US 2005/0074942 A1    Apr. 7, 2005

Related U.S. Application Data

(63) Continuation of application No. 10/678,761, filed on Oct. 2, 2003, now Pat. No. 6,740,563.

(51) Int. Cl.
    *H01L 29/76*    (2006.01)
(52) U.S. Cl. ............... 257/565; 257/345; 257/408; 257/607; 257/655
(58) Field of Classification Search .......... 257/565, 257/345, 344, 408, 607, 655
    See application file for complete search history.

(56) References Cited

U.S. PATENT DOCUMENTS 4,977,098 A * 12/1990 Yu et al. ............... 257/331
5,468,974 A    11/1995 Aronowitz et al.

OTHER PUBLICATIONS

Lurng Shehng Lee et al, "Reduction of Exitaxial Alignment in n+ -p poly-Si Emitter Diode due to Gettering of P and As by Ar Implantation", Electronics letters 16, Mar. 2000, vol. 36, No. 6, pp. 579-581.
Xiao Hong, "Introduction to Semiconductor Manufacturing Technology", 2001 pp. 67-69, pp. 78-79.

* cited by examiner

*Primary Examiner*—Edward Wojciechowicz
(74) *Attorney, Agent, or Firm*—Tung & Assoc.

(57) ABSTRACT

A method for fabricating a polysilicon emitter bipolar transistor employs a pair of ion implant methods. A first of the ion implant methods implants a portion of an intrinsic base region interposed between an extrinsic base region and a polysilicon emitter layer with an amorphizing non-active dopant. A second of the ion implant methods implants the polysilicon emitter layer with an active dopant to form a doped polysilicon emitter layer. The polysilicon emitter bipolar transistor is fabricated with enhanced performance.

14 Claims, 2 Drawing Sheets

AMORPHIZING ION IMPLANT METHOD FOR FORMING POLYSILICON EMITTER BIPOLAR TRANSISTOR

This is a continuation of application Ser. No. 10/678,761 filed on Oct. 02, 2003 now U.S. Pat. No. 6,740,563

BACKGROUND OF THE INVENTION

1. Field of the Invention

The invention relates generally to methods for forming bipolar transistor devices. More particularly, the invention relates to methods for forming bipolar transistor devices with enhanced performance.

2. Description of the Related Art

Semiconductor products often employ either or both of bipolar transistors and field effect transistors as switching devices or signal processing devices within electrical circuits. Digital semiconductor products generally employ field effect transistors while analog semiconductor products often employ bipolar transistors or bipolar complementary metal oxide semiconductor transistors (i.e., bipolar transistors in conjunction with field effect transistors).

Bipolar transistors are generally more complex to fabricate in comparison with field effect transistors. For that reason they are often difficult to fabricate with enhanced performance. In addition, such difficulties in fabrication are often more pronounced as bipolar transistor device dimensions are reduced.

It is thus desirable to provide methods for forming bipolar transistors with enhanced performance. The present invention is directed towards that object.

Various bipolar complementary metal oxide semiconductor transistors having desirable properties, and methods for fabrication thereof, have been disclosed in the semiconductor product fabrication art.

Included but not limiting among the methods are those disclosed within: (1) Lee, in U.S. Pat. No. 5,516,718 (a bipolar complementary metal oxide semiconductor transistor fabrication method that employs a polysilicon layer as a ion implant channeling reduction layer); (2) Robinson et al., in U.S. Pat. No. 5,541,120 (s bipolar complementary metal oxide semiconductor transistor fabrication method that employs annular insulator filler rings separating polysilicon emitter and extrinsic base regions); and (3) Naem, in U.S. Pat. No. 6,399,455 (a bipolar complementary metal oxide semiconductor transistor fabrication method that provides an ultra-small polysilicon emitter layer).

The disclosures of each of the foregoing references are incorporated herein fully by reference.

Desirable are additional methods for forming bipolar transistors and bipolar complementary metal oxide semiconductor transistors with enhanced performance.

The invention is directed towards the foregoing object.

SUMMARY OF THE INVENTION

A first object of the invention is to provide a method for fabricating a bipolar transistor.

A second object of the invention is to provide a method in accord with the first object of the invention, wherein the bipolar transistor is fabricated with enhanced performance.

In accord with the objects of the invention, the invention provides a method for fabricating a bipolar transistor.

The method first provides a semiconductor substrate having formed therein: (1) an intrinsic base region of a first polarity which includes a surface of the semiconductor substrate; (2) an extrinsic base region of the first polarity formed adjoining the intrinsic base region; and (3) a collector region of a second polarity opposite the first polarity formed within the semiconductor substrate and beneath the intrinsic base region. The method next provides for forming a polysilicon emitter layer upon the intrinsic base region and separated from the extrinsic base region. The method still further provides for first implanting a portion of the intrinsic base region interposed between the extrinsic base region and the polysilicon emitter layer with an amorphizing non-active dopant. The method finally provides for next implanting the polysilicon emitter layer with an active dopant to form a doped polysilicon emitter layer.

The invention provides a method for fabricating a bipolar transistor with enhanced performance.

The invention realizes the foregoing object within the context of fabricating a polysilicon emitter bipolar transistor having a polysilicon emitter layer formed upon an intrinsic base region within a semiconductor substrate and separated from an extrinsic base region formed adjoining the intrinsic base region. The invention provides for: (1) first implanting a portion of the intrinsic base region interposed between the extrinsic base region and the polysilicon emitter layer with an amorphizing non-active dopant; prior to (2) next implanting the polysilicon emitter layer with an active dopant to form a doped polysilicon emitter layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for fabricating a bipolar transistor with enhanced performance.

The invention realizes the foregoing object within the context of fabricating a polysilicon emitter bipolar transistor having a polysilicon emitter layer formed upon an intrinsic base region within a semiconductor substrate and separated from an extrinsic base region formed adjoining the intrinsic base region. The invention provides for: (1) first implanting a portion of the intrinsic base region interposed between the extrinsic base region and the polysilicon emitter layer with an amorphizing non-active dopant prior to; (2) next implanting the polysilicon emitter layer with an active dopant to form a doped polysilicon emitter layer.

FIG. 1 to FIG. 5 show a series of schematic cross-sectional diagrams illustrating the results of progressive stages of fabricating a semiconductor product having formed therein a bipolar transistor in accord with a preferred embodiment of the invention. While FIG. 1 to FIG. 5 show with specificity the results of fabricating a bipolar transistor, as is understood by a person skilled in the art, the invention is also applicable to a bipolar transistor portion of a bipolar complementary metal oxide semiconductor transistor. Methods for fabricating such devices are disclosed within the references cited within the Description of the Related Art, the disclosures of which are incorporated herein fully by reference.

Figure 1:
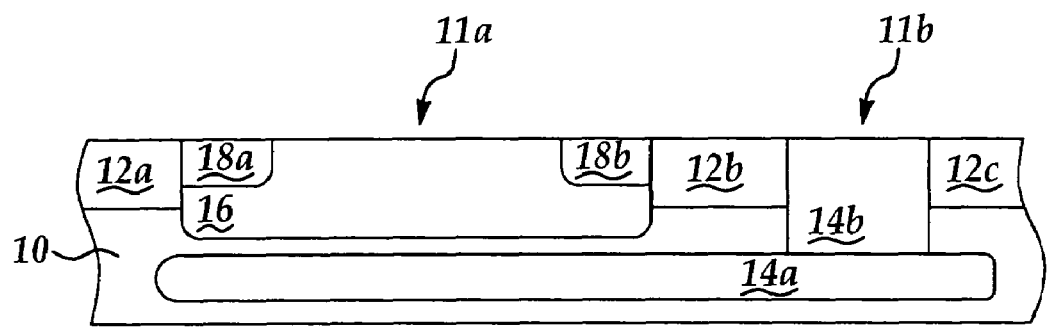
FIG. 1, FIG. 2, FIG. 3, FIG. 4 and FIG. 5 show a series of schematic cross-sectional diagrams illustrating the results of progressive stages in forming a bipolar transistor in accord with a preferred embodiment of the invention.

FIG. 1 shows a semiconductor substrate 10 having formed therein a series of isolation regions 12a, 12b and 12c that defines a pair of active regions 11a and 11b of the semiconductor substrate 10.

The semiconductor substrate 10 may be of either dopant polarity, several dopant concentrations and various crystallographic orientations. The semiconductor substrate 10 may, for example and without limitation, be a silicon semiconductor substrate or a silicon-germanium alloy semiconductor substrate.

The series of isolation regions 12a, 12b and 12c may also be conventional and be formed employing conventional methods. Although the schematic diagram of FIG. 1 illustrates the series of isolation regions 12a, 12b and 12c as a series of shallow trench isolation regions, the invention is not intended to be so limited. Rather the series of isolation regions 12a, 12b and 12c may also include local oxidation of silicon (LOCOS) isolation regions.

FIG. 1 also shows: (1) a collector region 14a beneath the pair of active regions 11a and 11b of the semiconductor substrate 10; and (2) a collector connection region 14b adjoining the collector region 14a and surfacing at the active region 11b of the semiconductor substrate 10.

Each of the collector region 14a and the collector connection region 14b is typically of the same polarity as the semiconductor substrate 10 (which is preferably of N polarity but may be of either N or P polarity), but with a generally higher dopant concentration in a range of from about 1E18 to about 1E20 dopant atoms per cubic centimeter such as to provide a low resistance connection.

FIG. 1 also shows an intrinsic base region 16 formed within the active region 11a of the semiconductor substrate 10 and a pair of extrinsic base regions 18a and 18b formed adjoining thereto at a periphery of the intrinsic base region 16.

Each of the intrinsic base region 16 and the pair of extrinsic base regions 18a and 18b is formed of a polarity opposite the collector region 14a and the collector connection region 14b (i.e., preferably of P polarity but may be of either P or N polarity). The intrinsic base region 16 preferably has a dopant concentration of from about 1E14 to about 1E16 dopant atoms per cubic centimeter while each of the pair of extrinsic base regions 18a and 18b has a dopant concentration of from about 1E16 to about 1E18 dopant atoms per cubic centimeter.

In order to fabricate the semiconductor product of FIG. 1, the collector region 14a may be formed upon an exposed surface of a semiconductor substrate and an epitaxial layer may then be formed upon the semiconductor substrate to form the semiconductor substrate 10. The series of isolation regions 12a, 12b and 12c may then be formed into the epitaxial layer portion of the semiconductor substrate 10. Finally, in conjunction with appropriate photomasking, the collector connection region 14b, the intrinsic base region 16 and the pair of extrinsic base regions 18a and 18b may be formed employing three separate ion implant process steps, in any order.

Figure 2:
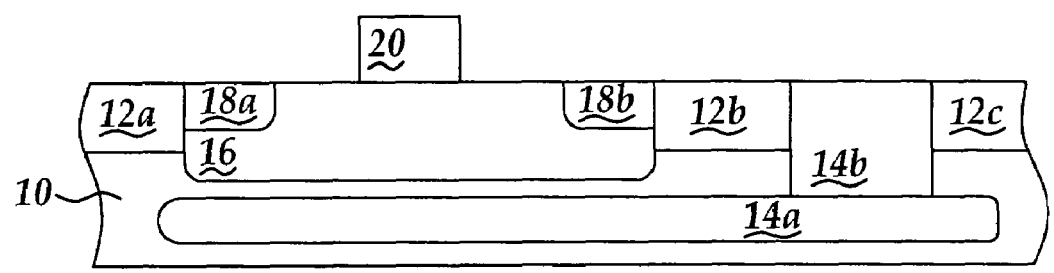

FIG. 2 shows a polysilicon emitter layer 20 formed upon the active region 11a of the semiconductor substrate 10. The polysilicon emitter layer 20 is nominally centered within the intrinsic base region 16 and separated from the pair of extrinsic base regions 18a and 18b by exposed portions of the intrinsic base region 16.

The polysilicon emitter layer 20 may be formed employing patterning methods as are conventional in the semiconductor product fabrication art, with particular consideration for limiting any etching of the active regions 11a and 11b of the semiconductor substrate 10. Typically, the polysilicon emitter layer 20 is formed to a thickness of from about 1000 to about 3000 angstroms.

Figure 3:
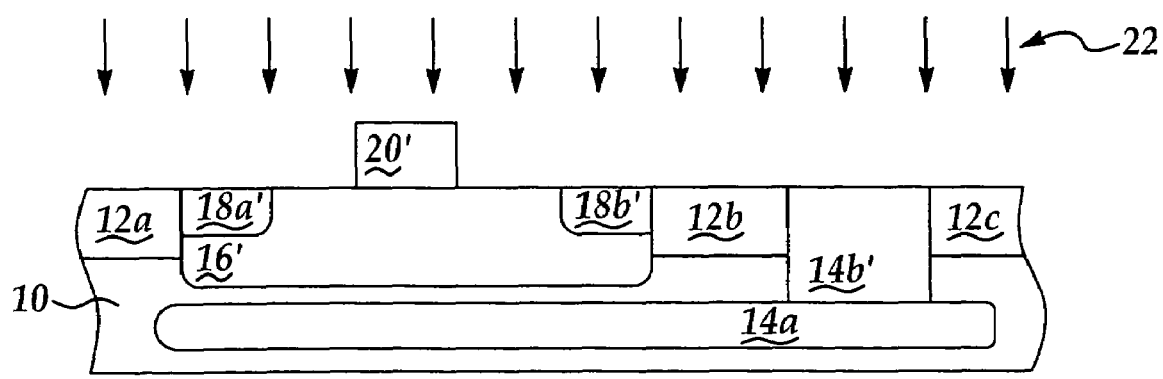

FIG. 3 shows the results of ion implanting the semiconductor product of FIG. 2 while employing a dose of amorphizing non-active dopant ions 22. The ion implanting forms: (1) an amorphized collector connection region 14b' from the collector connection region 14b; (2) an amorphized intrinsic base region 16' from the intrinsic base region 16; (3) a pair of amorphized extrinsic base regions 18a' and 18b' from the pair of extrinsic base regions 18a and 18b; and (4) an amorphized polysilicon emitter layer 20' from the polysilicon emitter layer 20.

The dose of amorphizing non-active dopant ions 22 may employ amorphizing non-active dopants as are otherwise generally conventional in the art. Such amorphizing non-active dopants may include, but are not limited to silicon and argon amorphizing non-active dopants. Typically, the dose of amorphizing non-active dopant ions 22 is provided at a dose of from about 1E13 to about 1E15 dopant atoms per cubic centimeter and an energy of from about 60 to about 80 kev.

Figure 4:
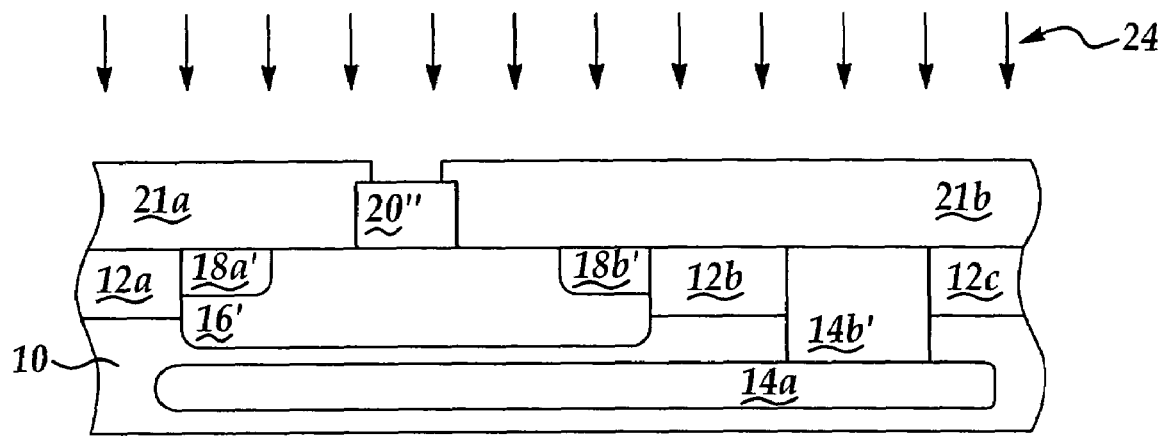

FIG. 4 first shows a pair of patterned photoresist layers 21a and 21b formed upon the microelectronic product of FIG. 3. The pair of patterned photoresist layers 21a and 21b leaves exposed the amorphized polysilicon emitter layer 20'. FIG. 4 also shows a dose of active dopant ions 24 (of same polarity as the collector region 14a) that is employed for implanting the exposed portion of the amorphized polysilicon emitter layer 20a' to form a doped amorphized polysilicon emitter layer 20". Such implanting with the dose of active dopant ions 24 is undertaken for purposes of providing an appropriate doping level and conductivity of a doped polysilicon emitter layer formed from the doped amorphized polysilicon emitter layer 20". Under circumstances where the polysilicon emitter layer 20 is formed incident to patterning of a blanket polysilicon layer that also provides a pair of gate electrodes within a pair of field effect transistor devices employed within a bipolar complementary metal oxide semiconductor transistor product, the series of patterned polysilicon layers will often require different dopant polarities and concentrations. Thus, it is common that the polysilicon emitter layer 20 may be formed of an undoped polysilicon material.

Figure 5:
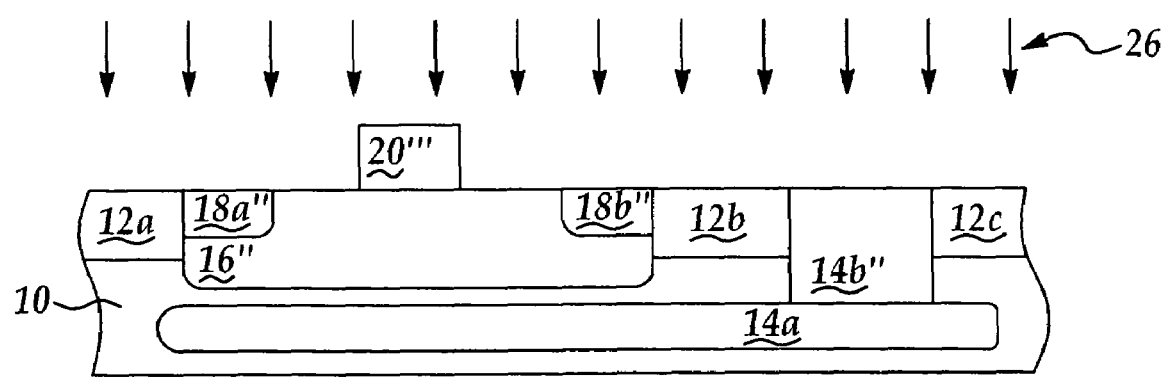

FIG. 5 first shows the results of stripping the pair of patterned photoresist layers 21a and 21b from the semiconductor product of FIG. 4. The pair of patterned photoresist layers 21a and 21b may be stripped employing methods and materials as are otherwise conventional in the semiconductor product fabrication art.

In addition, FIG. 5 illustrates the results of thermally annealing the resulting semiconductor product in a thermal annealing environment 26 to: (1) form from the amorphized collector connection region 14b' a thermally annealed amorphized collector connection region 14b"; (2) form from the amorphized intrinsic base region 16' a thermally annealed amorphized intrinsic base region 16"; (3) form from the pair of amorphized extrinsic base regions 18a' and 18b' a pair of thermally annealed amorphized extrinsic base regions 18a" and 18b"; and (4) form from the doped amorphized polysilicon emitter layer 20" a thermally annealed doped amorphized polysilicon emitter layer 20'". The thermal annealing of the foregoing layers provides for a recrystallization of the foregoing layers and thus functional enablement of a bipolar transistor in accord with the invention. The thermal annealing environment 26 is typically provided at a temperature of from about 900 to about 1100 degrees centigrade for a time period of from about 0.5 to about 2.0 hours.

FIG. 5 shows a schematic diagram of a semiconductor product having formed therein a bipolar transistor in accord with the invention. The bipolar transistor is formed with enhanced performance incident to ion implanting a portion of an intrinsic base region interposed between an extrinsic base region and a polysilicon emitter layer with an amorphizing non-active dopant prior to ion implanting the polysilicon emitter layer with an active dopant to form a doped polysilicon emitter layer. While not wishing to be bound to any particular theory of operation of the invention, it is believed that the amorphizing non-active dopant ion implanting provides for an amorphization of the portion of the intrinsic base 16 interposed between the pair of extrinsic base regions 18a and 18b and the polysilicon emitter layer 20, such as to provide for an attenuation of any channeling therein incident to the active dopant ion implanting as illustrated in FIG. 4. Such channeling might occur should the pair of patterned photoresist layers 21a and 21b not provide inadequate coverage of the sidewalls of the amorphized polysilicon emitter layer 20'.

In order to illustrate the value of the invention, a pair of bipolar transistor devices was fabricated. One was fabricated generally in accord with the preferred embodiment of the invention while employing an amorphizing non-active dopant ion implant employing an argon dopant at an ion implantation dose of about 1E13 dopant atoms per cubic centimeter and an ion implantation energy of about 70 kev. The other bipolar transistor employed no amorphizing non-active dopant ion implantation.

A current gain was measured for each of the pair of bipolar transistors while employing methods as are conventional in the art. The measured current gain for the bipolar transistor fabricated in accord with the invention was 1.00 while for the bipolar transistor fabricated not in accord with the invention the current gain was compromised at about 0.54.

The preferred embodiment of the invention is illustrative of the invention rather than limiting of the invention. Revisions and modifications may be made to materials, structures and dimensions in accord with the preferred embodiment of the invention, while still providing a method for forming a bipolar transistor in accord with the invention, further in accord with the accompanying claims.

What is claimed is:

1. A bipolar transistor comprising recrystallized amorphized semiconductor portions to achieve improved performance comprising:
   a semiconductor substrate having formed therein:
      an intrinsic base region of a first polarity which includes a surface of the semiconductor substrate;
      an extrinsic base region of the first polarity formed adjoining the intrinsic base region;
      a collector region of a second polarity opposite the first polarity formed within the semiconductor substrate and beneath the intrinsic base region; and,
      a polysilicon emitter layer formed upon the intrinsic base region and separated from the extrinsic base region, wherein a portion of the intrinsic base region interposed between the extrinsic base region and the polysilicon emitter layer comprises recrystallized amorphized semiconductor, said amorphized semiconductor having incorporated therein a non-active dopant to form said amorphized semiconductor.

2. The bipolar transistor of claim 1 wherein the first polarity is an N polarity.

3. The bipolar transistor of claim 1 wherein the first polarity is a P polarity.

4. The bipolar transistor of claim 1 wherein the non-active dopant is provided at a concentration of from about 1E12 to about 1E14 dopant atoms per cubic centimeter.

5. The bipolar transistor of claim 1 wherein the non-active dopant is an argon dopant.

6. The bipolar transistor of claim 1 wherein the extrinsic base region also comprises recrystallized amorphized semiconductor, said amorphized semiconductor having incorporated therein the non-active dopant to form said amorphized semiconductor.

7. The bipolar transistor of claim 1 wherein the polysilicon emitter also comprises recrystallized amorphized semiconductor, said amorphized semiconductor has having incorporated therein the non-active dopant to form said amorphized semiconductor.

8. The bipolar transistor of claim 1 wherein said intrinsic base region, extrinsic base region, collector region, and polysilicon emitter layer further comprise active dopants.

9. The bipolar transistor of claim 1 wherein said collector region is separated from said intrinsic base region.

10. The bipolar transistor of claim 1 wherein said collector region includes a connector portion extending to the semiconductor substrate surface.

11. A bipolar transistor comprising recrystallized amorphized semiconductor portions to achieve improved performance comprising:
    a semiconductor substrate having formed therein:
       an intrinsic base region of a first polarity which includes a surface of the semiconductor substrate;
       an extrinsic base region of the first polarity formed adjoining the intrinsic base region;
       a collector region of a second polarity opposite the first polarity formed within the semiconductor substrate and beneath the intrinsic base region;
       a polysilicon emitter layer formed upon the intrinsic base region and separated from the extrinsic base region;
       wherein the intrinsic base region interposed between the extrinsic base region and the polysilicon emitter layer, the extrinsic base region, and the polysilicon emitter layer comprise recrystallized amorphized semiconductor material, said amorphized semiconductor material having ion-implanted therein a non-active dopant to form said amorphized semiconductor.

12. The bipolar transistor of claim 11 wherein said intrinsic base region, extrinsic base region, collector region, and polysilicon emitter layer further comprise active dopants.

13. The bipolar transistor of claim 11 wherein said collector region is separated from said intrinsic base region.

14. The bipolar transistor of claim 11 wherein said collector region includes a connector portion extending to the semiconductor substrate surface.

* * * * *